United States Patent
Mizuno et al.

(10) Patent No.: US 7,895,731 B2
(45) Date of Patent: Mar. 1, 2011

(54) METHOD FOR MANUFACTURING MAGNETIC FIELD DETECTING ELEMENT UTILIZING DIFFUSION AND MIGRATION OF SILVER

(75) Inventors: Tomohito Mizuno, Tokyo (JP); Yoshihiro Tsuchiya, Tokyo (JP); Koji Shimazawa, Tokyo (JP); Kei Hirata, Tokyo (JP); Keita Kawamori, Tokyo (JP)

(73) Assignee: TDK Corporation, Tokyo (JP)

( * ) Notice: Subject to any disclaimer, the term of this patent is extended or adjusted under 35 U.S.C. 154(b) by 888 days.

(21) Appl. No.: 11/766,926

(22) Filed: Jun. 22, 2007

(65) Prior Publication Data
US 2007/0297104 A1 Dec. 27, 2007

(30) Foreign Application Priority Data
Jun. 23, 2006 (JP) ................ 2006-173801

(51) Int. Cl.
*G11B 5/127* (2006.01)
*H04R 31/00* (2006.01)

(52) U.S. Cl. ............... 29/603.13; 29/603.11; 29/603.14; 29/603.15; 29/603.16; 360/97.01; 360/128; 360/137; 360/324.11; 360/324.12; 427/127; 427/128

(58) Field of Classification Search ............... 29/603.11, 29/603.13–603.16, 603.18; 360/97.01, 128, 360/137, 324.11, 324.12, 326; 427/127, 427/128
See application file for complete search history.

(56) References Cited

U.S. PATENT DOCUMENTS
6,917,088 B2  7/2005  Takahashi et al.
7,672,092 B2 *  3/2010  Tsuchiya et al. ......... 360/324.12

FOREIGN PATENT DOCUMENTS

| JP | 2002-026281 A | 1/2002 |
|---|---|---|
| JP | 2002-270921 A | 9/2002 |
| JP | 2003-218428 | 7/2003 |
| JP | 2003-218428 A | 7/2003 |
| JP | 2004-39941 | 2/2004 |
| JP | 2004-146480 A | 5/2004 |
| JP | 2005-203774 A | 7/2005 |
| JP | 2006-114868 A | 4/2006 |

* cited by examiner

*Primary Examiner* — Paul D Kim
(74) *Attorney, Agent, or Firm* — Knobbe, Martens, Olson & Bear, LLP

(57) ABSTRACT

A method for manufacturing a magnetic field detecting element having a free layer whose magnetization direction is variable depending on an external magnetic field and a pinned layer whose magnetization direction is fixed and these are stacked with an electrically conductive, nonmagnetic spacer layer sandwiched therebetween, wherein sense current flows in a direction perpendicular to film planes of the magnetic field detecting element. The method comprises: forming a spacer adjoining layer adjacent to the spacer layer, Heusler alloy layer, and a metal layer successively in this order; and forming either at least a part of the pinned layer or the free layer by heating the spacer adjoining layer, the Heusler alloy layer, and the metal layer. The spacer adjoining layer has a layer chiefly made of cobalt and iron. The Heusler alloy layer includes metal which is silver, gold, copper, palladium, or platinum, or an alloy thereof. The metal layer is made of the same.

6 Claims, 7 Drawing Sheets ously been used. For
METHOD FOR MANUFACTURING MAGNETIC FIELD DETECTING ELEMENT UTILIZING DIFFUSION AND MIGRATION OF SILVER The present application is based on, and claims priority from, J.P. Application No. 2006-173801, filed on Jun. 23, 2006, the disclosure of which is hereby incorporated by reference herein in its entirety.

BACKGROUND OF THE INVENTION

1. Field of the Invention

The present invention relates to a magnetic field detecting element that is used in a hard disk drive, and more particularly to a method for manufacturing a magnetic field detecting element.

2. Description of the Related Art

Spin-valve-type GMR (Giant Magneto-Resistive) heads are known in the art as magnetic heads that meet requirements for high sensitivity and high output. A magnetic field detecting element that is used in a spin-valve-type GMR head comprises a free layer and a pinned layer that are stacked one on the other with a nonmagnetic spacer layer sandwiched therebetween. The free layer is a ferromagnetic material layer whose magnetization direction is variable depending on an external magnetic field. The pinned layer is a ferromagnetic material layer whose magnetization direction is fixed with respect to the external magnetic field. The magnetization direction of the free layer forms a relative angle with respect to the magnetization direction of the pinned layer depending on the external magnetic field. Depending on the relative angle, a change in the spin-dependent scattering of conduction electrons is caused and, as a result, a change in magneto-resistance is caused. The magnetic head detects such a change in magneto-resistance so as to read magnetic information that is recorded in a recording medium.

The pinned layer may be constructed as a so-called synthetic pinned layer. The synthetic pinned layer comprises an outer pinned layer, whose magnetization direction is fixed with respect to an external magnetic field, an inner pinned layer, which is disposed closer to a spacer layer than the outer pinned layer, and a nonmagnetic intermediate layer that is sandwiched between the outer pinned layer and the inner pinned layer. The magnetization direction of the inner pinned layer is firmly fixed by antiferromagnetic coupling with the outer pinned layer. Further, since the magnetic moment of the outer pinned layer and that of the inner pinned layer cancel each other out, overall leakage of magnetic field is limited.

Many types of GMR heads are known. Of the many types of GMR heads, a CPP (Current-Perpendicular-to-the-Plane)-GMR head, in which sense current flows in a direction that is perpendicular to the film planes, has been studied because it is capable of obtaining stable output voltage even when it is used for a high-density recording medium having a narrow track width. The CPP-GMR head is also advantageous in that it has a high efficiency for heat radiation and accommodates a high operating current because of the structure in which the magnetic field detecting element and shield layers are connected to each other via metal layers. In the CPP-GMR head, the magnetic field detecting element exhibits a large resistance value and resultantly an increased output voltage in accordance with the decrease in the cross section thereof. Therefore, the CPP-GMR head is more suitable for a narrow track width.

The change in magneto-resistance becomes larger as the spin polarizability of the free layer and the pinned layer becomes larger. Therefore, if a material having large spin polarizability is used for the free layer and the pinned layer, then the magneto-resistance ratio (MR ratio), as well as output voltage, becomes larger. A magnetic material whose spin polarizability is 100% or nearly 100% is called "half metal". Heusler alloy is known as one of the materials that realize the half-metal. In recent years, it has been proposed to use the Heusler alloy in the free layer and the pinned layer, rather than CoFe alloy and NiFe alloy that have heretofore been used. For example, JP-A 2003-218428 discloses a technology for using $CO_2MnZ$ (Z represents an element that is selected from the group consisting of Al, Si, Ga, Ge, and Sn) as a magnetic field detecting element in a CPP-GMR head.

If Heusler alloy is used in the free layer and the pinned layer, then heat treatment (annealing) at a relatively high temperature is required in order to provide regularization of crystal that is required to achieve half-metal characteristics. The temperature of the heat treatment is often no less than about 573K (300° C.). However, the magnetic field detecting element is covered with shield layers at its upper and lower surfaces in order to detect the magnetic field that is generated by a specific recording bit only of the recording medium. Because the temperature of the heat treatment is close to the upper limit temperature for ensuring that the nature of the shield layer is maintained, it is impossible to increase the annealing temperature far beyond the above-mentioned temperature if the Heusler alloy is used in the free layer and the pinned layer. Consequently, the Heusler alloy is not sufficiently regularized, and it is impossible to fully exploit the nature of the Heusler alloy.

SUMMARY OF THE INVENTION

The object of the present invention is to provide a magnetic field detecting element that is used in a CPP-GMR head which allows reduction of regularization temperature. Another object of the present invention is to provide a method for manufacturing such a magnetic field detecting element.

A method for manufacturing a magnetic field detecting element comprising a free layer whose magnetization direction is variable depending on an external magnetic field and a pinned layer whose magnetization direction is fixed with respect to the external magnetic field, said free layer and said pinned layer being stacked with an electrically conductive, nonmagnetic spacer layer sandwiched therebetween, wherein sense current is configured to flow in a direction that is perpendicular to film planes of the magnetic field detecting element is provided. The method comprises the steps of: forming a spacer adjoining layer that is adjacent to said spacer layer, Heusler alloy layer, and a metal layer successively in this order; and forming either at least a part of said pinned layer or said free layer by heating said spacer adjoining layer, said Heusler alloy layer, and said metal layer. The spacer adjoining layer comprises a layer that is chiefly made of cobalt and iron. The Heusler alloy layer includes metal which is silver, gold, copper, palladium, or platinum, or an alloy thereof. The metal layer is made of silver, gold, copper, palladium, or platinum, or an alloy thereof.

Silver, gold, copper, palladium, or platinum (hereinafter referred to as "silver-type metal") forms a solid solution in a metal layer that is made of the silver-type metal. Because the silver-type metal that is included in the Heusler alloy does not form a solid solution in the Heusler alloy, part of the silver-type metal is diffused and migrates into the metal layer, in which the silver-type metal forms a solid solution, when the Heusler alloy is heated. When the silver-type metal moves through the crystal portion of the Heusler alloy, stress in the Heusler alloy is mitigated, regularization of the Heusler alloy is promoted, and the regularization temperature is reduced. In this way, it is possible to reduce the regularization temperature of the Heusler alloy by adding silver-type metal, which does not form a solid solution in the Heusler alloy, to the Heusler alloy, then by depositing a layer of silver-type metal on the Heusler alloy, and then by heating the layers. The same effect can be obtained by adding an alloy, which contains at least two elements from among silver, gold, copper, palladium, and platinum, to the Heusler alloy layer, or by forming the metal layer using such an alloy.

The metal that is included in said Heusler alloy layer is preferably the same as material that constitutes the metal layer.

Silver that is included in the Heusler alloy layer preferably has an atomic fraction ranging between 1% and 20%.

The free layer may be formed by heating the spacer adjoining layer, the Heusler alloy layer, and the metal layer. The metal layer preferably has a thickness ranging between 0.2 nm and 2 nm.

The pinned layer may comprise: an outer pinned layer whose magnetization direction is fixed with respect to the external magnetic field; and an inner pinned layer whose magnetization direction is fixed by the outer pinned layer, the inner pinned layer being disposed closer to the spacer layer than the outer pinned layer. The inner pinned layer may be formed by heating the spacer adjoining layer, the Heusler alloy layer, and the metal layer. The metal layer preferably has a thickness ranging between 0.2 nm and 0.4 nm.

The spacer adjoining layer, the Heusler alloy layer, and the metal layer are preferably heated at a temperature ranging between 523 K and 673 K.

According to another embodiment, a magnetic field detecting element comprises: a free layer whose magnetization direction is variable depending on an external magnetic field; a pinned layer whose magnetization direction is fixed with respect to the external magnetic field; and a nonmagnetic spacer layer that is sandwiched between the free layer and the pinned layer. Sense current is configured to flow in a direction that is perpendicular to film planes of the magnetic field detecting element. Either the free layer or the pinned layer or both the free layer and the pinned layer comprise an spacer adjoining layer that is adjacent to the spacer layer, Heusler alloy layer that is adjacent to the spacer adjoining layer, and a metal layer that is adjacent to the Heusler alloy layer. The metal layer includes metal which is silver, gold, copper, palladium, or platinum, or an alloy thereof, the metal has been diffused and migrated from the Heusler alloy layer.

The metal may be silver.

According to another embodiment, a stacked structure includes the magnetic field detecting element mentioned above.

According to another embodiment, a wafer that is used for manufacturing the stacked structure includes at least one magnetic field detecting element mentioned above.

According to another embodiment, a head gimbal assembly comprises: a slider including the stacked structure mentioned above, the slider being adapted to be disposed opposite to a recording medium; and a suspension resiliently supporting the slider.

According to another embodiment, a hard disk drive comprises:

a slider that includes the stacked structure mentioned above, the slider being disposed opposite to a rotatable disk-shaped recording medium; and a positioning device for supporting the slider and for positioning the slider with respect to the recording medium.

The above and other objects, features and advantages of the present invention will become apparent from the following description with reference to the accompanying drawings which illustrate examples of the present invention.

DESCRIPTION OF THE PREFERRED EMBODIMENT

An embodiment of a thin-film magnetic head that incorporates a magnetic field detecting element according to the present invention will be described in detail with reference to the drawings. While a thin-film magnetic head that is used in a hard disk drive will be described below, the magnetic field detecting element according to the present invention is also applicable to a magnetic memory device, a magnetic sensor assembly, and so on.

Figure 1:
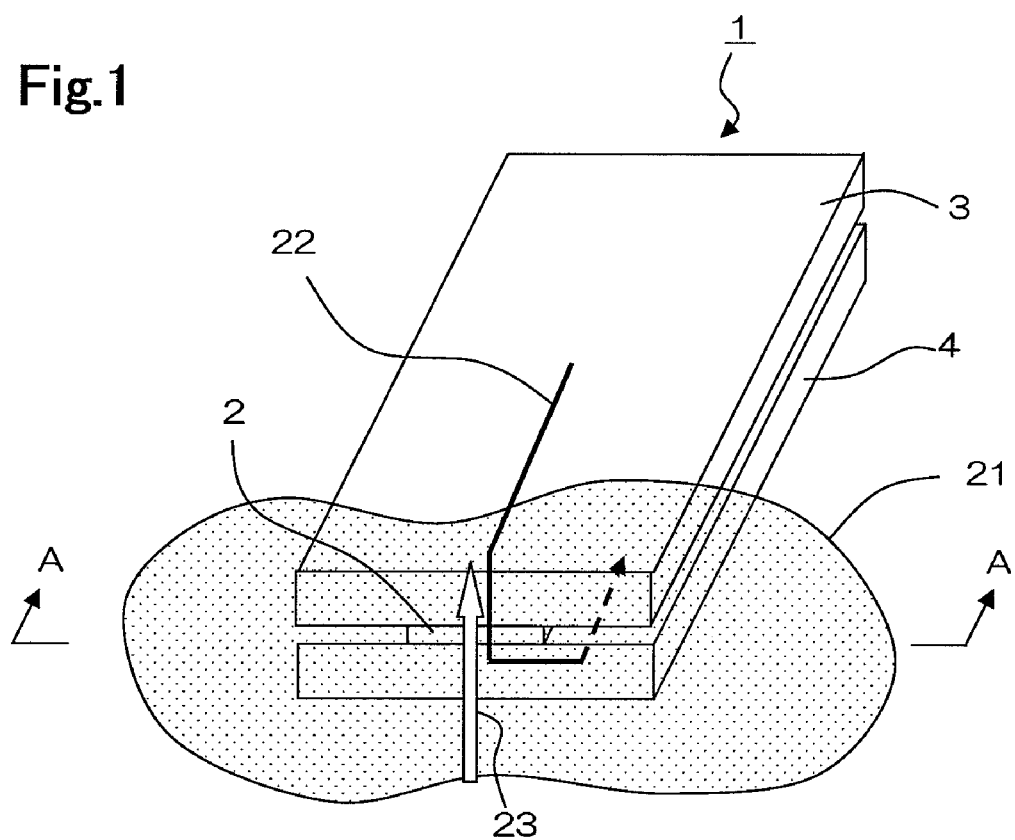
FIG. 1 is a partial perspective view of a thin-film magnetic head that incorporates a magnetic field detecting element according to the present invention.

FIG. 1 is a partial perspective view of a thin-film magnetic head that incorporates a magnetic field detecting element according to the present invention. Thin-film magnetic head 1 may be a read-only head or may be an MR/inductive composite head that further includes a write head portion. Magnetic field detecting element 2 is sandwiched between upper electrode/shield 3 and lower electrode/shield 4 with a tip end thereof disposed at a location that faces recording medium 21. When a voltage is applied between upper electrode/shield 3 and lower electrode/shield 4, sense current 22 flows in a direction that is perpendicular to the film planes of magnetic field detecting element 2. Then, magnetic field of recording medium 21 at the location that faces magnetic field detecting element 2 changes in accordance with the movement of recording medium 21 in moving direction 23. Magnetic field detecting element 2 detects a change in the magnetic field as a change in electric resistance of sense current 22 based on the GMR effect, and thereby reads magnetic information that is written in each magnetic domain of recording medium 21.

1st Embodiment

Figure 2:
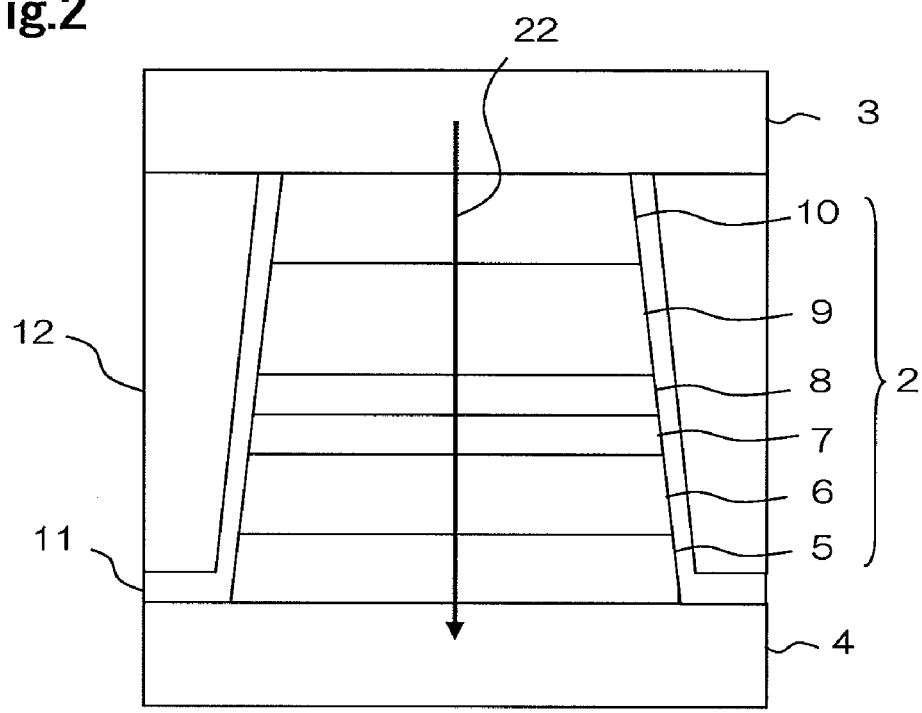
FIG. 2 is a side elevational view of a magnetic field detecting element, viewed from line A-A of FIG. 1.

FIG. 2 is a side elevational view of the magnetic field detecting element, viewed from line A-A of FIG. 1, or viewed from the air bearing surface. The air bearing surface refers to the surface of thin-film magnetic head 1 that faces recording medium 21. Table 1 shows an exemplary layer configuration of thin-film magnetic head 1. Table 1 shows the layer configuration in the order of stacking, i.e., starting with buffer layer 5 in the bottom row, which is in contact with lower electrode/shield 4, ending with cap layer 10 in the top row, which is in contact with upper electrode/shield 3. In the description and tables, the numerals in the notation, such as Co70Fe30, represent atomic fractions (%) of elements. It should be noted that traces of other elements may be added as long as equivalent magnetic characteristics can be achieved. In other words, each layer does not have to be made of the elements which are indicated in the table.

TABLE 1

| | Layer Configuration | Composition |
|---|---|---|
| | Cap Layer 10 | Ru |
| Free Layer 9 | Metal Layer 94 | Ag |
| | Heusler Alloy Layer 92 | $Co_2MnSi$ |
| | Spacer Adjacent Layer 91 | Co70Fe30 |
| | Spacer Layer 8 | Cu |
| Pinned Layer 7 | Inner Pinned Layer 73 | Co30Fe70 |
| | | $Co_2MnSi$ |
| | | Co70Fe30 |
| | Non-magnetic Spacer Layer 72 | Ru |
| | Outer Pinned Layer 71 | Co70Fe30 |
| | Anti-ferromagnetic Layer 6 | IrMn |
| | Buffer Layer 5 | NiFeCr |
| | | Ta |

Magnetic field detecting element 2 is a stacked structure that includes buffer layer 5, which is made of a Ta layer and a NiCr layer, antiferromagnetic layer 6, which is made of an IrMn layer, pinned layer 7, spacer layer 8, which is made of a Cu layer, free layer 9, and cap layer 10. These layers are successively stacked upwardly in this order on lower electrode/shield 4 that is made of a NiFe layer having a thickness of about 2 µm. In the present specification, the expression "A1/ . . . /An" generally refers to a stacked structure having layers A1 through An which are stacked in this order. The layer configuration of buffer layer 5 is selected such that sufficient exchange coupling with antiferromagnetic layer 6 is achieved. The Cu layer of spacer layer 8 may contain some additives as long as it is chiefly made of Cu. Cap layer 10, which is made of a Ru layer, is provided in order to prevent the layers that are stacked therebelow from being deteriorated. Cap layer 10 is covered with upper electrode/shield 3 that has a NiFe layer having a thickness of about 2 µm. Hard bias films 12 are disposed on both sides of magnetic field detecting element 2 via insulating films 11. Hard bias films 12 serve as magnetic domain control films for magnetizing free layer 9 into a single magnetic domain. Insulating films 11 are made of $Al_2O_3$, and hard bias films 12 are made of CoPt, CoCrPt, or the like.

Pinned layer 7 is a layer whose magnetization direction is fixed with respect to an external magnetic field. In the present embodiment, pinned layer 7 is constructed as a so-called synthetic pinned layer. Specifically, pinned layer 7 has outer pinned layer 71, inner pinned layer 73 that is disposed closer to spacer layer 8 than outer pinned layer 71, and nonmagnetic intermediate layer 72 that is sandwiched between outer pinned layer 71 and inner pinned layer 73. In the synthetic pinned layer, outer pinned layer 71 and inner pinned layer 73 are antiferromagnetically coupled to each other via nonmagnetic intermediate layer 72. Therefore, effective magnetization of pinned layer 7 is limited, and a stable magnetization state of pinned layer 7 is ensured.

Outer pinned layer 71 is made of FeCo so that a desired magnitude of exchange coupling with antiferromagnetic layer 6 is achieved. Inner pinned layer 73 consists of a stacked structure of Co70Fe30/Heusler alloy/30Co70Fe. The Heusler alloy is made of, for example, $Co_2MnSi$. However, the Heusler alloy is not limited to $Co_2MnSi$, and is generally made of a substance that is represented by the composition $X_2YZ$ (X represents an element that is selected from the group consisting of group 3A and group 2B of the periodic table, Y represents manganese (Mn), and Z represents at least one element that is selected from the group consisting of aluminum (Al), silicon (Si), gallium (Ga), germanium (Ge), indium (In), tin (Sn), thallium (Tl), lead (Pb), and antimony (Sb)). Nonmagnetic intermediate layer 72 is made of a Ru layer in order to achieve antiferromagnetic coupling between outer pinned layer 71 and inner pinned layer 73. Nonmagnetic intermediate layer 72 has a thickness of 0.8 nm. Alternatively, the thickness may be 0.4 nm.

Free layer 9 is a layer whose magnetization direction is variable depending on the external magnetic field. Free layer 9 has spacer adjoining layer 91, Heusler alloy layer 92, and metal layer 94. Spacer adjoining layer 91 is a cobalt-alloy layer that is made of 70Co30Fe. Heusler alloy layer 92 is made of $Co_2MnSi$, but may be made of a substance represented by the general composition $X_2YZ$. Metal layer 94 is made of silver. Part of the silver in metal layer 94 is silver that has been diffused and that has migrated from Heusler alloy layer 92, as described later. Therefore, Heusler alloy layer 92 may contain some remaining silver. Metal layer 94 may be made of gold, copper, palladium, or platinum, or may be made of an alloy containing at least two elements from among silver, gold, copper, palladium, and platinum. Similarly to the case in which silver is used, part of the metal(s) in metal layer 94 is metal(s) that has been diffused and that has migrated from Heusler alloy layer 92.

2nd Embodiment

Table 2 shows an exemplary layer configuration in which the above-mentioned structure of the free layer is also applied to the inner pinned layer. Inner pinned layer 73 has a stacked structure of Co70Fe30/silver/Heusler alloy/30Co70Fe. The Heusler alloy is made of, for example, $Co_2MnSi$, but it may be made of a substance represented by the general composition $X_2YZ$. The Heusler alloy may contain some remaining silver. Part of the silver in the silver layer is silver that has been diffused and that has migrated from the Heusler alloy layer in the same manner as described above. Instead of the silver layer, inner pinned layer 73 may contain a layer that is made of gold, copper, palladium, or platinum, or a layer that is made of an alloy containing at least two elements from among silver, gold, copper, palladium, and platinum. Similarly to the first embodiment, part of the metal(s) has been diffused and has migrated from the Heusler alloy layer.

TABLE 2

| | Layer Configuration | Composition |
|---|---|---|
| | Cap Layer 10 | Ru |
| Free Layer 9 | Metal Layer 94 | Ag |
| | Heusler Alloy Layer 92 | $Co_2MnSi$ |
| | Spacer Adjacent Layer 91 | Co70Fe30 |
| | Spacer Layer 8 | Cu |
| Pinned Layer 7 | Inner Pinned Layer 73 | Co30Fe70 |
| | | $Co_2MnSi$ |
| | | Ag |
| | | Co70Fe30 |
| | Non-magnetic Spacer Layer 72 | Ru |
| | Outer Pinned Layer 71 | Co70Fe30 |
| | Anti-ferromagnetic Layer 6 | IrMn |
| | Buffer Layer 5 | NiFeCr |
| | | Ta |

The thin-film magnetic head having the layer configuration of the first embodiment is manufactured as follows. First, lower electrode/shield 4 is formed on a substrate, not shown, that is made of a ceramic material, such as AlTiC ($Al_2O_3.TiC$), via an insulating layer, not shown. Then, the layers starting with buffer layer 5 and ending with spacer layer 8 are successively deposited on lower electrode/shield 4 by means of sputtering. Then, spacer adjoining layer 91 is deposited on spacer layer 8, Heusler alloy layer 92 is deposited on spacer adjoining layer 91, and metal layer 94 is deposited on Heusler alloy layer 92. Thereafter, cap layer 10 is deposited on metal layer 94. Heusler alloy layer 92 contains silver. This layer configuration can be achieved by simultaneously depositing Heusler alloy, such as $Co_2MnSi$, and silver by means of sputtering. It should be noted that silver does not exist as a solid solution in the Heusler alloy, but only co-exists with the Heusler alloy. Subsequently, the stacked structure starting with buffer layer 5 and ending with cap layer 10 is shaped into appropriate sizes. Table 3 shows the layer configuration when the deposition process described above is completed. The thickness of metal layer 94 preferably ranges between 0.2 nm and 2 nm. Thereafter, the entire substrate on which the layers are deposited is heated (annealed). If a write head portion is further provided in the thin-film magnetic head, then a write magnetic pole layer and a coil are formed. Then, the entire wafer is covered with a protective film, diced, lapped, and separated into stacked structures or sliders each having a thin-film magnetic head.

TABLE 3

| | Layer Configuration when Deposition Process is Completed | | Thickness (nm) |
|---|---|---|---|
| | Cap Layer 10 | Ru | 10 |
| Free Layer 9 | Metal Layer 94 | Ag | 1 |
| | Heusler Alloy Layer 92 | $Co_2MnSi$ + Ag | 6 |
| | Spacer Adjacent Layer 91 | Co70Fe30 | 1 |
| | Spacer Layer 8 | Cu | 3 |
| Pinned Layer 7 | Inner Pinned Layer 73 | Co30Fe70 | 1 |
| | | $Co_2MnSi$ | 6 |
| | | Co70Fe30 | 1 |
| | Non-magnetic Spacer Layer 72 | Ru | 0.8 |
| | Outer Pinned Layer 71 | Co70Fe30 | 5 |
| | Anti-ferromagnetic Layer 6 | IrMn | 7 |
| | Buffer Layer 5 | NiFeCr | 5 |
| | | Ta | 1 |

Figure 3:
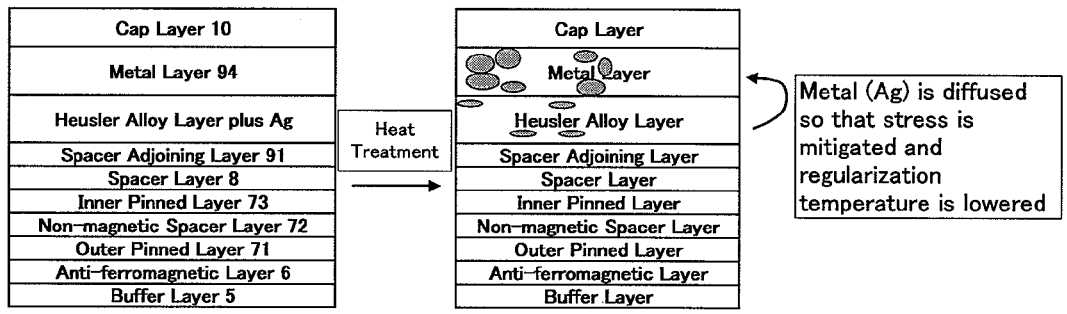
FIG. 3 is a schematic diagram illustrating diffusion and migration of silver.

The present embodiment is characterized in that spacer adjoining layer 91 is deposited first, then Heusler alloy layer 92 with which silver is mixed is deposited on spacer adjoining layer 91, and then metal layer 94, which is made of silver, is deposited on Heusler alloy layer 92. Silver which is mixed with Heusler alloy layer 92 does not form a solid solution in Heusler alloy layer 92, but easily forms a solid solution in metal layer 94 because metal layer 94 is also made of silver. As schematically shown in FIG. 3, the silver that is mixed with Heusler alloy layer 92 is diffused and migrates into metal layer 94 that is adjacent to Heusler alloy layer 92 by means of heating. However, it should be noted that not all of the silver that is contained in Heusler alloy layer 92 is diffused and migrates into metal layer 94 and that part of the silver remains in Heusler alloy layer 92 depending on the ratio of the silver in Heusler alloy layer 92 and on the annealing conditions. The appropriate ratio (atomic fraction) of silver in Heusler alloy layer 92 is in the range between 1% and 20%. When the silver is diffused and migrates, it moves through the crystalline portion of the Heusler alloy. The movement of the silver mitigates stress in the Heusler alloy, promotes regularization of the Heusler alloy, and reduces the regularization temperature. As described above, Heusler alloy layer 92 may contain gold, copper, palladium, or platinum, or may contain an alloy containing at least two elements from among silver, gold, copper, palladium, and platinum, instead of silver, because these metals are similar to silver in that they rather tend to be diffused and migrates from Heusler alloy layer 92 rather than form a solid solution in Heusler alloy layer 92. It should be noted that gold is the second best material next to silver with regard to the property of diffusion and migration.

Alternatively, the layer configuration shown in Table 4 may be employed instead of the layer configuration shown in Table 3. According to the layer configuration shown in Table 4, metal, such as silver, is not mixed with Heusler alloy layer 92. Instead, metal layer 93 is deposited on Heusler alloy layer 92, and then metal layer 94 is deposited on metal layer 93. Metal layer 93 is preferably made of silver, and metal layer 94 is preferably made of gold, copper, palladium, or platinum.

TABLE 4

| | Layer Configuration when Deposition Process is Completed | | Thickness (nm) |
|---|---|---|---|
| | Cap Layer 10 | Ru | 10 |
| Free Layer 9 | Metal Layer 94 | Au, Ag, Pd, or Pt | 1 |
| | Metal Layer 93 | Ag | 0.5 |
| | Heusler Alloy Layer 92 | $Co_2MnSi$ + Ag | 6 |
| | Spacer Adjacent Layer 91 | Co70Fe30 | 1 |
| | Spacer Layer 8 | Cu | 3 |
| Pinned Layer 7 | Inner Pinned Layer 73 | Co30Fe70 | 1 |
| | | $Co_2MnSi$ | 6 |
| | | Co70Fe30 | 1 |
| | Non-magnetic Spacer Layer 72 | Ru | 0.8 |
| | Outer Pinned Layer 71 | Co70Fe30 | 5 |
| | Anti-ferromagnetic Layer 6 | IrMn | 7 |
| | Buffer Layer 5 | NiFeCr | 5 |
| | | Ta | 1 |

A thin-film magnetic head having the layer configuration of the second embodiment is manufactured in the same manner as described above. First, lower electrode/shield 4 is formed on a substrate, not shown, that is made of a ceramic material, such as AlTiC ($Al_2O_3.TiC$), via an insulating layer, not shown. Then, the layers starting with buffer layer 5 and ending with spacer layer 8 are successively deposited on lower electrode/shield 4 by means of sputtering. In order to form inner pinned layer 73, Co70Fe30 and silver are deposited, and thereafter the Heusler alloy layer with which silver is mixed is deposited by simultaneously depositing Heusler alloy, such as $Co_2MnSi$, and silver by means of sputtering.

Then, spacer adjoining layer 91, which is made of Co30Fe70, is deposited. Thereafter, spacer layer 8 is deposited on spacer adjoining layer 91. The subsequent processes are the same as described above. Table 5 shows the layer configuration when the deposition process described above is completed. It should be appreciated that although the layer structure that is specific to the present embodiment is applied to both the free layer and the pinned layer in the layer configuration shown in Table 5, it may also be applied to the pinned layer alone. In this case, the free layer may have a layer configuration made of Co70Fe30/Heusler alloy.

TABLE 5

| | Layer Configuration when Deposition Process is Completed | | Thickness (nm) |
|---|---|---|---|
| | Cap Layer 10 | Ru | 10 |
| Free Layer 9 | Metal Layer 94 | Ag | 1 |
| | Heusler Alloy Layer 92 | $Co_2MnSi + Ag$ | 6 |
| | Spacer Adjacent Layer 91 | Co70Fe30 | 1 |
| | Spacer Layer 8 | Cu | 3 |
| Pinned Layer 7 | Inner Pinned Layer 73 | Co30Fe70 | 1 |
| | | $Co_2MnSi + Ag$ | 6 |
| | | Ag | 0.4 |
| | | Co70Fe30 | 1 |
| | Non-magnetic Spacer Layer 72 | Ru | 0.8 |
| | Outer Pinned Layer 71 | Co70Fe30 | 5 |
| Anti-ferromagnetic Layer 6 | | IrMn | 7 |
| Buffer Layer 5 | | NiFeCr | 5 |
| | | Ta | 1 |

The silver layer in inner pinned layer 73 preferably has a thickness of 0.2 nm to 0.4 nm. The thickness of the silver layer is smaller than that of the silver layer (metal layer 94) in free layer 9 in order to limit adverse effect on exchange coupling with outer pinned layer 7. Specifically, it is required that inner pinned layer 73 and outer pinned layer 71 be magnetically coupled in anti-parallel directions through exchange-coupling via nonmagnetic intermediate layer 72. However, if the thickness of the silver layer is too large, sufficient exchange coupling between inner pinned layer 73 and outer pinned layer 71 is impeded by the thick silver layer. As a result, inner pinned layer 73 and outer pinned layer 71 are not magnetized in anti-parallel directions, and the nature of pinned layer 7 as a unitary magnetic body will be lost.

Alternatively, the layer configuration shown in Table 6 may be employed instead of the layer configuration shown in Table 5. The layer configuration shown in Table 6 is based on the same concept as in the layer configuration shown in Table 4. Specifically, the Heusler alloy layer of inner pinned layer 73 does not contain metal, such as silver. Instead, a silver layer is deposited beneath the Heusler alloy layer in direct contact therewith, and a layer that is made of cold, copper, palladium, or platinum is deposited beneath the silver layer in direct contact therewith.

TABLE 6

| | Layer Configuration when Deposition Process is Completed | | Thickness (nm) |
|---|---|---|---|
| | Cap Layer 10 | Ru | 10 |
| Free Layer 9 | Metal Layer 94 | Au, Ag, Pd, or Pt | 1 |
| | Metal Layer 93 | Ag | 0.5 |
| | Heusler Alloy Layer 92 | $Co_2MnSi + Ag$ | 6 |
| | Spacer Adjacent Layer 91 | Co70Fe30 | 1 |
| | Spacer Layer 8 | Cu | 3 |
| Pinned Layer 7 | Inner Pinned Layer 73 | Co30Fe70 | 1 |
| | | $Co_2MnSi$ | 6 |
| | | Ag | 0.3 |
| | | Au, Ag, Pd, or Pt | 0.3 |
| | | Co70Fe30 | 1 |
| | Non-magnetic Spacer Layer 72 | Ru | 0.8 |
| | Outer Pinned Layer 71 | Co70Fe30 | 5 |
| Anti-ferromagnetic Layer 6 | | IrMn | 7 |
| Buffer Layer 5 | | NiFeCr | 5 |
| | | Ta | 1 |

It was experimentally confirmed that the regularization temperature of the Heusler alloy according to the present embodiments was reduced. The regularization temperature of the Heusler alloy is determined by the magnitude of coercive force, based on the general characteristic that the coercive force is large when the Heusler alloy is in an irregular state and that the coercive force is reduced as it becomes regularized. The layer configuration that was used for the experiment is shown in Table 7. Table 7 shows the layer configuration before the element was subjected to annealing. Samples used for the experiment were fabricated through the deposition process and the annealing process. The deposition process was performed for three types of layer configurations, i.e., the layer configuration of the first embodiment shown in Table 3, a layer configuration in which Heusler alloy alone was deposited (Comparative Example 1), and a layer configuration in which silver was deposited on the Heusler alloy (Comparative Example 2). The ratio (atomic fraction) of silver in Heusler alloy layer 92 in the first embodiment was set to be 16%.

TABLE 7

| | | First Embodiment | | Comparative Example 1 | | Comparative Example 2 | |
|---|---|---|---|---|---|---|---|
| | | Layer Configuration when Deposited | Thickness(nm) | Layer Configuration when Deposited | Thickness(nm) | Layer Configuration when Deposited | Thickness(nm) |
| | Cap Layer 10 | Ru | 10 | same as First Embodiment | | same as First Embodiment | |
| Free Layer 9 | Metal Layer 94 | Ag | 1 | — | | Ag | 1 |
| | Heusler Alloy Layer 92 | $Co_2MnSi + Ag$ | 6 | $Co_2MnSi$ | 6 | $Co_2MnSi$ | 6 |
| | Spacer Adjacent Layer 91 | Co70Fe30 | 1 | Co70Fe30 | 1 | Co70Fe30 | 1 |
| | Spacer Layer 8 | Cu | 3 | same as First Embodiment | | same as First Embodiment | |
| Pinned Layer 7 | Inner Pinned Layer 73 | Co30Fe70 | 1 | | | | |
| | | $Co_2MnSi$ | 6 | | | | |
| | | Co70Fe30 | 1 | | | | |
| | Non-magnetic Spacer Layer 72 | Ru | 0.8 | | | | |
| | Outer Pinned Layer 71 | Co70Fe30 | 5 | | | | |

TABLE 7-continued

|  | First Embodiment | | Comparative Example 1 | | Comparative Example 2 | |
|---|---|---|---|---|---|---|
|  | Layer Configuration when Deposited | Thickness(nm) | Layer Configuration when Deposited | Thickness(nm) | Layer Configuration when | Thickness(nm) |
| Anti-ferromagnetic Layer 6 | IrMn | 7 | | | | |
| Buffer Layer 5 | NiFeCr | 5 | | | | |
|  | Ta | 1 | | | | |

Figure 4:
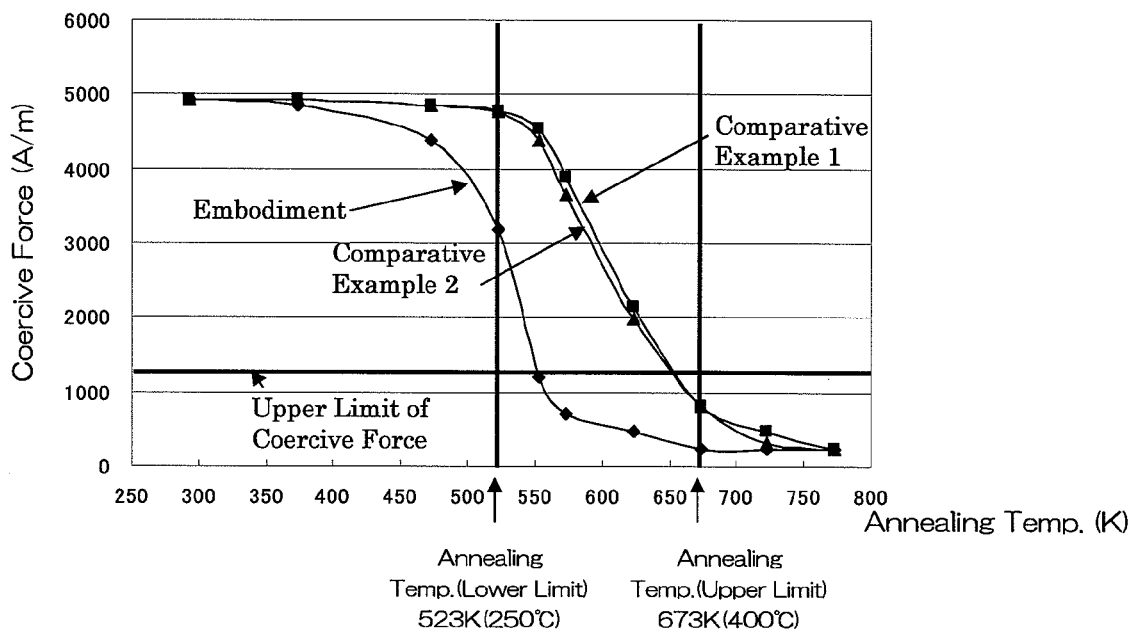
FIG. 4 is a graph showing the relationship between the coercive force of the Heusler alloy and the annealing temperature.

Table 8 and FIG. 4 show the test result that illustrates the relationship between the coercive force of Heusler alloy layer 92 in free layer 9 and the annealing temperature. The upper limit of the coercive force for practical use as a magnetic field detecting element is about 1190 A/m (15 Oe). In each comparative example, an annealing temperature of about 650 K is required in order obtain a coercive force of Heusler alloy layer 92 that does not exceed the above upper limit. On the contrary, regularization of the Heusler alloy is promoted and the coercive force is reduced to the practical level at a relatively low annealing temperature of about 550 K in the layer configuration according to the first embodiment.

It is desirable that the annealing temperature be at least 523 K (250° C.). This annealing temperature is a minimum temperature that is required to fix the magnetization direction of the pinned layer. It is desirable that the upper limit of the annealing temperature be 673 K (400° C.). This temperature, which was obtained by way of an experiment, corresponds to the average temperature at which $Co_2MnSi$ and $Co_2MnGe$ are regularized and exhibit magnetization. Even if silver is added to $Co_2MnSi$, $Co_2MnSi$ is completely regularized at the approximately same temperature. It should be noted that if the annealing temperature is too high, then upper electrode/shield 3 and lower electrode/shield 4 fail to exhibit sufficient magnetic permeability (shielding characteristics), as described above. For example, it is desirable that the upper limit of the annealing temperature be no more than about 623 K (350° C.) when upper electrode/shield 3 and lower electrode/shield 4 are made of NiFe layers. If the layer configurations according to the comparative examples are used, then it is impossible to reduce the coercive force of the free layer while keeping the shielding characteristics of the shield layers at this temperature. However, if the layer configuration according to the first embodiment is used, then it is possible to sufficiently reduce the coercive force of the free layer, leading to the effect of the present embodiment.

TABLE 8

Unit: A/m

| Annealing Temp. (K) | First Embodiment | Comparative Example 1 | Comparative Example 2 |
|---|---|---|---|
| 293 | 4934 | 4934 | 4934 |
| 373 | 4854 | 4934 | 4934 |
| 473 | 4377 | 4854 | 4854 |
| 523 | 3183 | 4775 | 4775 |
| 553 | 1194 | 4536 | 4377 |
| 573 | 716 | 3899 | 3661 |
| 623 | 477 | 2149 | 1989 |
| 673 | 239 | 796 | 796 |
| 723 | 239 | 477 | 318 |
| 773 | 239 | 239 | 239 |

Figure 5:
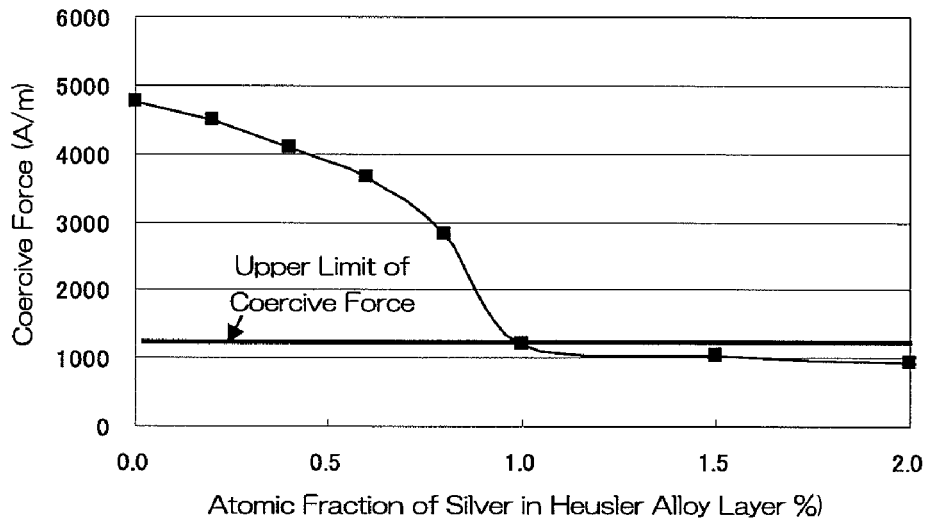
FIG. 5 is a graph showing the relationship between the atomic fraction of silver in the Heusler alloy and the coercive force of the Heusler alloy.

A proper range of atomic fraction (concentration) of silver in the Heusler alloy layer will be described below. In order to determine the lower limit of atomic fraction of silver, coercive force of Heusler alloy layer 92 was measured for various atomic fractions of silver in Heusler alloy layer 92 of the free layer, which was varied between 0% and 2% with an increment of 0.2 to 0.5%. Table 9 and FIG. 5 show the results. When the atomic fraction of the silver exceeds 1%, the coercive force falls below 1190 A/m, which is the target value. Therefore, it is required that the atomic fraction of the silver in Heusler alloy layer 92 in the free layer be at least 1%.

The same applies to the pinned layer. Specifically, it is necessary to use a Heusler alloy having a high regularization temperature, such as $Co_2MnSi$, $Co_2MnGe$, in order to obtain a CPP-GMR element having a large MR ratio. However, if the Heusler alloy is annealed at a high temperature, then upper electrode/shield 3 and lower electrode/shield 4 fail to exhibit a sufficiently large magnetic permeability (shielding characteristics). This makes it difficult to obtain good response (S/N ratio) to a magnetic field of a recording medium. Therefore, the Heusler alloy in inner pinned layer 73 needs to be regularized at a low temperature, and it is desirable that the atomic fraction of silver in the Heusler alloy layer in inner pinned layer be at least 1% in order to achieve sufficient regularization at a low temperature.

TABLE 9

| Atomic Percentge of Ag in Heusler Alloy layer (%) | Coercive Force (A/m) |
|---|---|
| 0.0 | 4773.4 |
| 0.2 | 4487.0 |
| 0.4 | 4097.2 |
| 0.6 | 3659.6 |
| 0.8 | 2824.3 |
| 1.0 | 1193.4 |
| 1.5 | 1034.2 |
| 2.0 | 954.7 |

Figure 6:
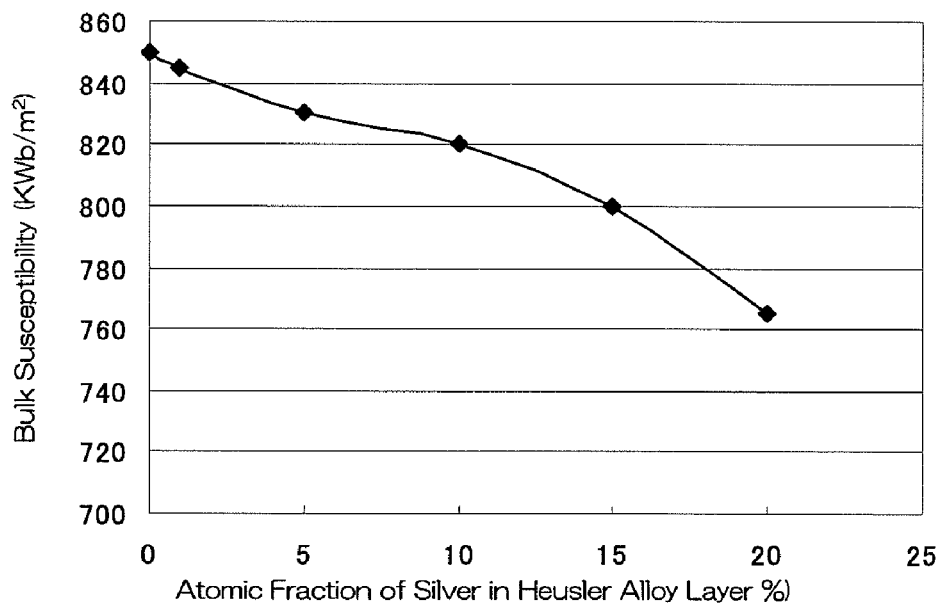
FIG. 6 is a graph showing the relationship between the atomic fraction of silver in the Heusler alloy and the bulk susceptibility of the Heusler alloy.

The upper limit of the atomic fraction of the silver in the Heusler alloy layer will be described below. Bulk susceptibility of the Heusler alloy layer was measured for various atomic fractions of silver in the Heusler alloy layer in inner pinned layer 73, which was varied between 0% and 20%. Table 10 and FIG. 6 show the results. As the bulk susceptibility of the Heusler alloy layer becomes larger, it is easier to ensure that the magnetization of inner pinned layer is firmly fixed. As the atomic fraction of silver becomes large, the bulk susceptibility of the Heusler alloy layer is decreased. In a CPP-GMR element, it is desirable that magnetization thickness of inner pinned layer 73 be equal to or greater than that of outer pinned layer 71 in order to obtain a CPP-GMR element having a large MR ratio. In the layer configuration of the pinned layer shown in Table 7, the magnetization thickness of outer pinned layer 71 is about $79000 \times 10^{-8}$ emu/cm$^2$. This value was calculated based on the consideration that a dead layer zone having a thickness of about 0.15 nm is produced in outer pinned layer 71 because of the diffusion of outer pinned layer 71 to antiferromagnetic layer 6 (IrMn layer) during the annealing process. In order to obtain inner pinned layer 73 having a magnetization thickness that is larger than that of outer pinned layer 71, taking into consideration errors in the experiment and calculation, a bulk susceptibility of no less than 760 kWb/m² is required for the Heusler alloy layer in inner pinned layer 73. This value corresponds to the atomic fraction of silver being about 20%.

It is also effective that the free layer has large bulk susceptibility in order to reduce the thickness of the free layer. Reduction in the layer thickness makes it easy to cope with a narrow track width. Similarly to the pinned layer, it is desirable that reduction in the bulk susceptibility be limited to about 10% or less and that the atomic fraction of silver in Heusler alloy layer 92 be about the same level as in inner pinned layer 73.

From the foregoing, it is desirable that the atomic fraction of silver in the Heusler alloy layer be between 1% and 20% for both the free layer and the pinned layer.

TABLE 10

| Atomic Percentge of Ag in Heusler Alloy layer (%) | Bulk Susceptibility (KWb/m2) |
|---|---|
| 0 | 850 |
| 1 | 845 |
| 5 | 830 |
| 10 | 820 |
| 15 | 800 |
| 20 | 765 |

Figure 7:
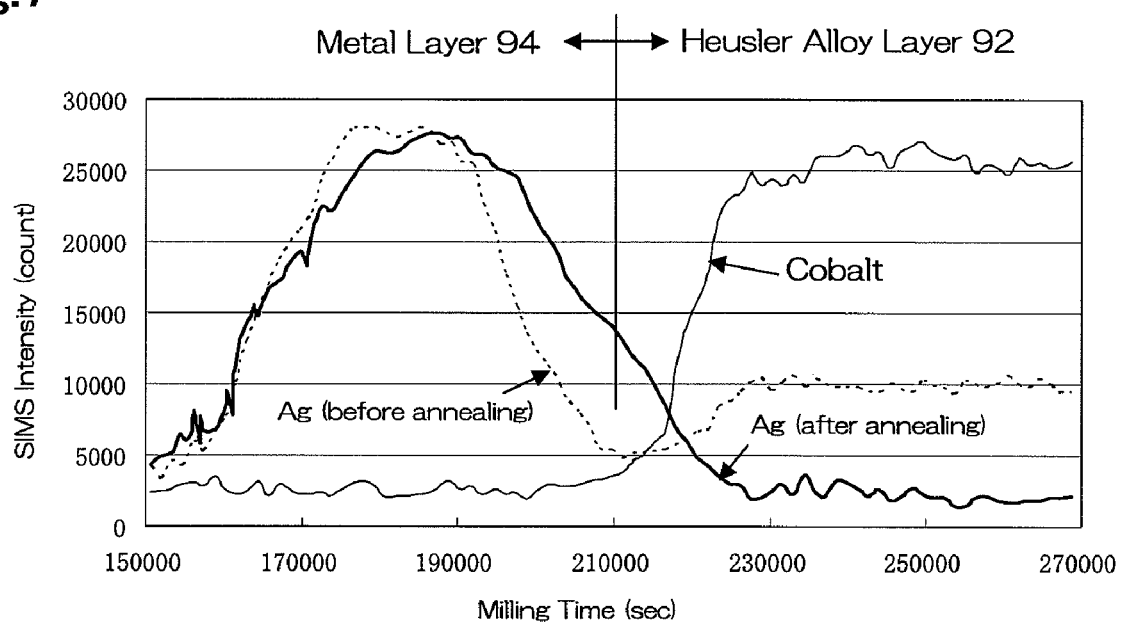
FIG. 7 is a graph showing the result of mass analysis according to SIMS.

Finally, it was confirmed that silver actually migrated toward the metal layer. FIG. 7 is a map, which was obtained by using secondary ion mass spectroscopy (SIMS), showing distribution of elements at various locations between the spacer layer and the Heusler alloy layer. The horizontal axis of the map represents the milling time that was measured from the free layer. This means that as the milling time becomes larger, the distribution of elements at a deeper location is represented in the graph. Silver was distributed in both Heusler alloy layer 92 and in metal layer 94 before annealing. After annealing, reduction in the amount of silver in Heusler alloy layer 92, as well as migration of silver to metal layer 94, was found. The amount of the reduction corresponds to the amount of the migration. From the SIMS analysis, it was confirmed that silver was diffused and migrated from Heusler alloy layer 92 to metal layer 94 during annealing.

In the above embodiments, explanation was given regarding the bottom-type CPP-GMR element. However, the present invention is also applicable to a top-type CPP-GMR element. Similar advantages, as described above, can be achieved for a top-type CPP-GMR element by using the same relative relationship among spacer layer 8, spacer adjoining layer 91, Heusler alloy layer 92, and metal layer 94 as in the embodiments described above so that the diffusion and migration of metal, such as silver, is caused in the same manner. Further, the pinned layer is not limited to a synthetic pinned layer, and may be a single layer structure in which antiferromagnetic coupling is not utilized.

Figure 8:
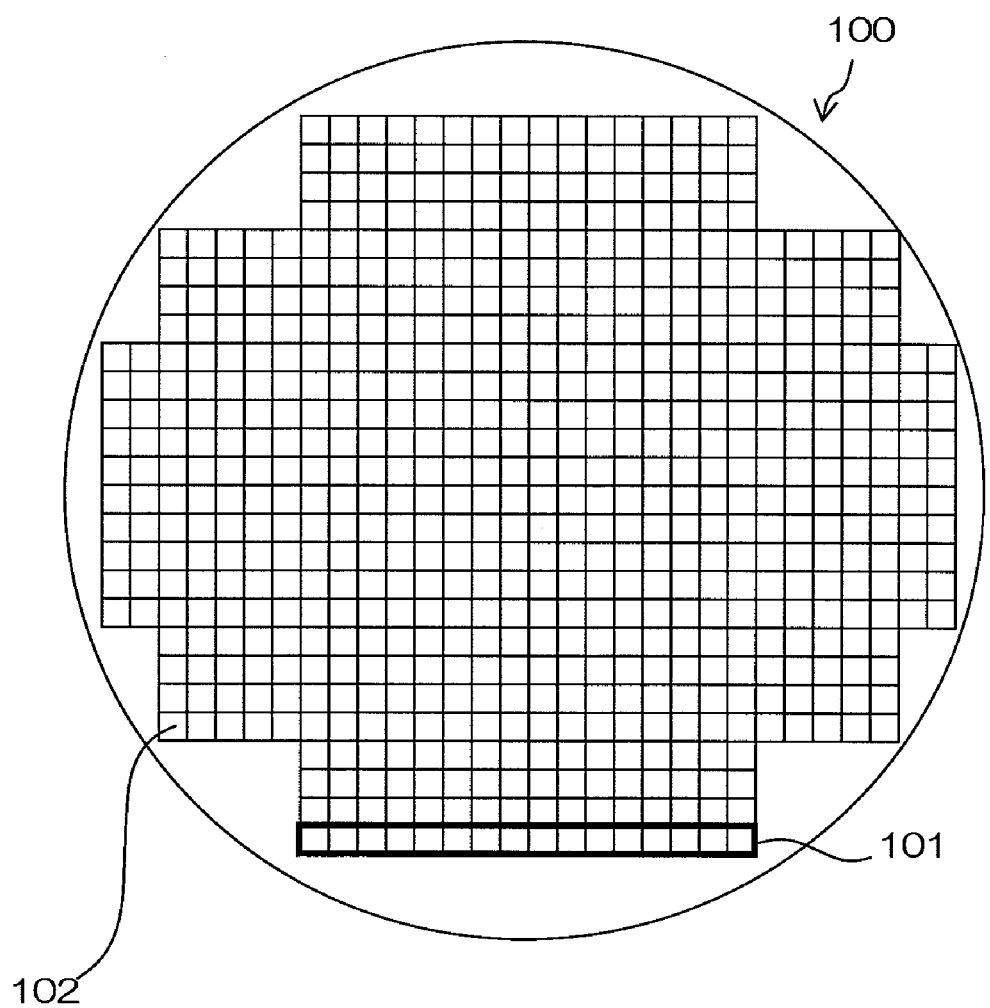
FIG. 8 is a plan view of a wafer for manufacturing a stacked structure according to the present invention.

Next, explanation will be made regarding a wafer for fabricating a thin-film magnetic head described above. FIG. 8 is a schematic plan view of a wafer. Wafer 100 has layers which are deposited thereon to form at least magnetic field detecting element 2. Wafer 100 is diced into bars 101 which serve as working units in the process of forming air bearing surface ABS. After lapping, bar 101 is diced into sliders 210 which include thin-film magnetic heads 1. Dicing portions, not shown, are provided in wafer 100 in order to dice wafer 100 into bars 101 and into sliders 210.

Figure 9:
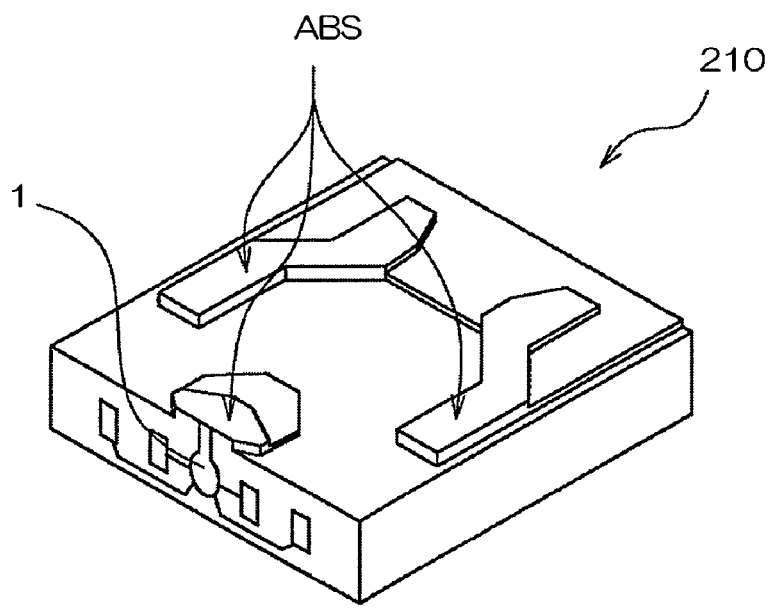
FIG. 9 is a perspective view of a slider which is included in a head gimbal assembly and which incorporates the stacked structure according to the present invention.
Figure 9:
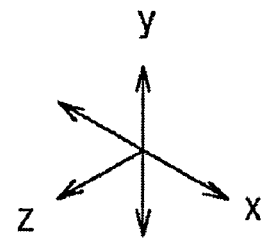

Referring to FIG. 9, slider 210 is a stacked structure including magnetic field detecting element 2. Slider 210 is disposed in a hard disk drive such that it is opposite to a rotatable disk-shaped recording medium, or a hard disk. Slider 210 has a substantially hexahedral shape. One of the six surfaces of slider 210 forms air bearing surface ABS, which is positioned opposite to the hard disk.

Figure 10:
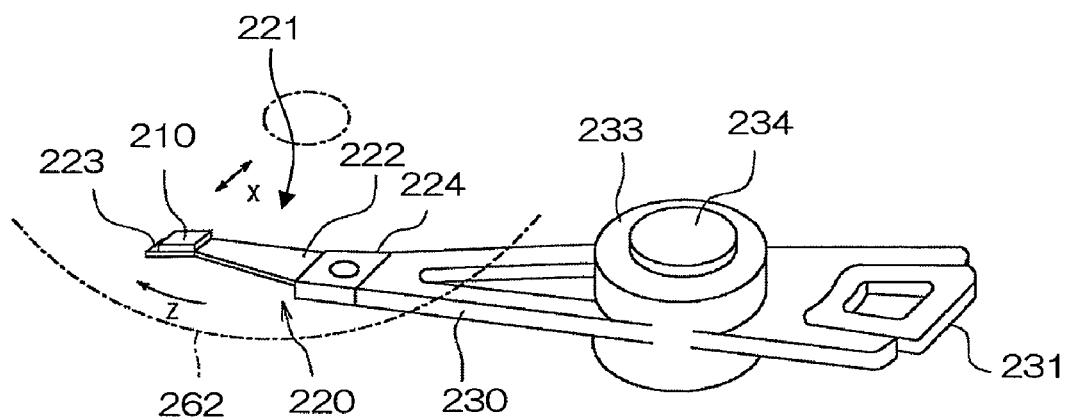
FIG. 10 is a perspective view of a head arm assembly which includes the head gimbal assembly which incorporates the stacked structure according to the present invention.

Referring to FIG. 10, head gimbal assembly 220 has slider 210 and suspension 221 for resiliently supporting slider 210. Suspension 221 has load beam 222 in the shape of a flat spring and made of, for example, stainless steel, flexure 223 that is attached to one end of load beam 222, and base plate 224 provided on the other end of load beam 222. Slider 210 is fixed to flexure 223 to provide slider 210 with an appropriate degree of freedom. The portion of flexure 223 to which slider 210 is attached has a gimbal section for maintaining slider 210 in a fixed orientation.

Slider 210 is arranged opposite to a hard disk, which is a rotationally-driven disc-shaped storage medium, in a hard disk drive. When the hard disk rotates in the z direction shown in FIG. 10, airflow which passes between the hard disk and slider 210 creates a dynamic lift, which is applied to slider 210 downward in the y direction. Slider 210 is configured to lift up from the surface of the hard disk due to this dynamic lift effect. Thin-film magnetic head 1 is formed in proximity to the trailing edge (the end portion at the lower left in FIG. 9) of slider 210, which is on the outlet side of the airflow.

The arrangement in which a head gimbal assembly 220 is attached to arm 230 is called a head arm assembly 221. Arm 230 moves slider 210 in transverse direction x with regard to the track of hard disk 262. One end of arm 230 is attached to base plate 224. Coil 231, which constitutes a part of a voice coil motor, is attached to the other end of arm 230. Bearing section 233 is provided in the intermediate portion of arm 230. Arm 230 is rotatably held by shaft 234 which is attached to bearing section 233. Arm 230 and the voice coil motor to drive arm 230 constitute an actuator.

Figure 11:
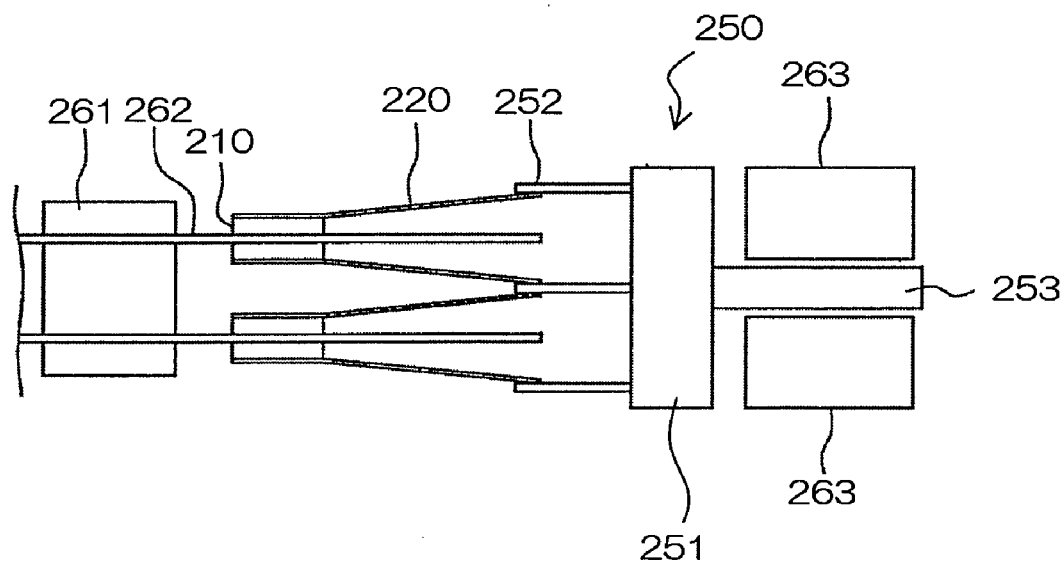
FIG. 11 is a side elevational view of the major portion of a hard disk drive which incorporates the stacked structure according to the present invention.
Figure 12:
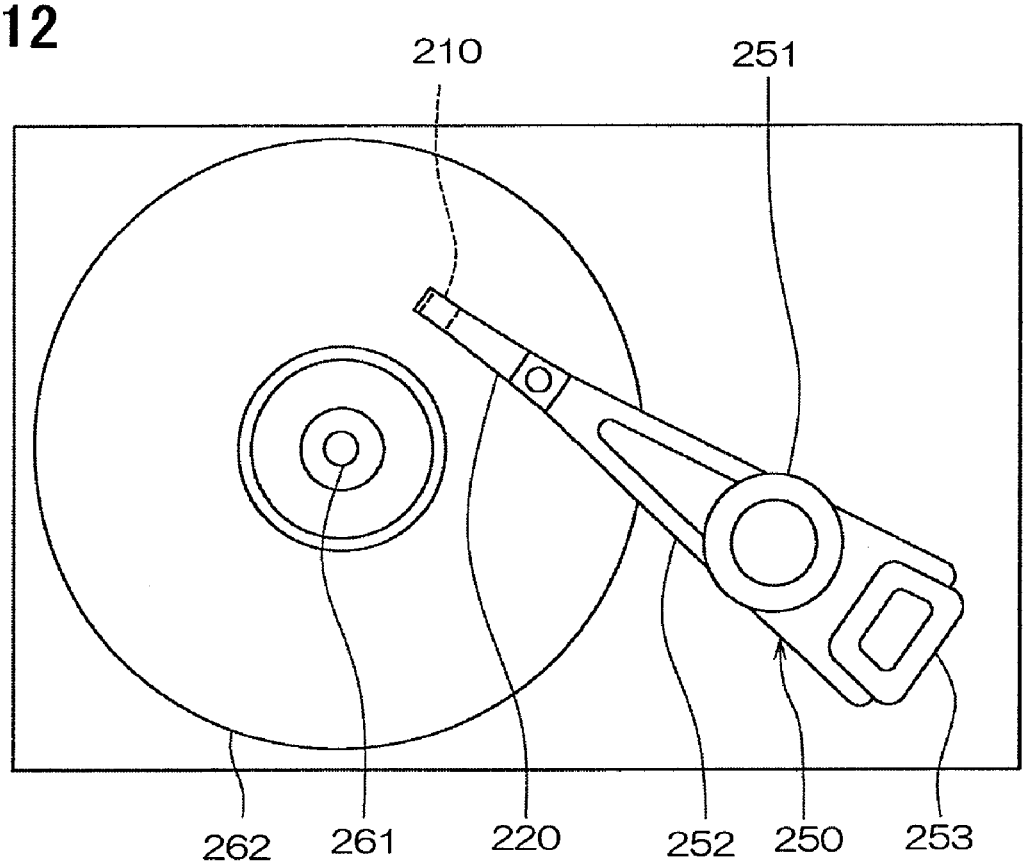
FIG. 12 is a plan view of a hard disk drive which incorporates the stacked structure according to the present invention.

Referring to FIG. 11 and FIG. 12, a head stack assembly and a hard disk drive that incorporate the slider mentioned above will be explained next. The arrangement in which head gimbal assemblies 220 are attached to the respective arm of a carriage having a plurality of arms is called a head stack assembly. FIG. 11 is a side view of a head stack assembly, and FIG. 12 is a plan view of a hard disk drive. Head stack assembly 250 has carriage 251 provided with a plurality of arms 252. Head gimbal assemblies 220 are attached to arms 252 such that head gimbal assemblies 220 are arranged apart from each other in the vertical direction. Coil 253, which constitutes a part of the voice coil motor, is attached to carriage 251 on the side opposite to arms 252. The voice coil motor has permanent magnets 263 which are arranged in positions that are opposite to each other and interpose coil 253 therebetween.

Referring to FIG. 12, head stack assembly 250 is installed in a hard disk drive. The hard disk drive has a plurality of hard disks which are connected to spindle motor 261. Two sliders 210 are provided per each hard disk 262 at positions which are opposite to each other and interpose hard disk 262 therebetween. Head stack assembly 250 and the actuator, except for sliders 210, work as a positioning device in the present invention. They carry sliders 210 and work to position sliders 210 relative to hard disks 262. Sliders 210 are moved by the actuator in the transverse direction with regard to the tracks of hard disks 262, and positioned relative to hard disks 262. Thin-film magnetic head 1 that is included in slider 210 writes information to hard disk 262 by means of the write head portion, and reads information recorded in hard disk 262 by means of the read head portion.

Although certain preferred embodiments of the present invention have been shown and described in detail, it should be understood that various changes and modifications may be made without departing from the spirit or scope of the appended claims.

What is claimed is:

1. The method for manufacturing a magnetic field detecting element comprising a free layer whose magnetization direction is variable depending on an external magnetic field and a pinned layer whose magnetization direction is fixed with respect to the external magnetic field, said free layer and said pinned layer being stacked with an electrically conductive, nonmagnetic spacer layer sandwiched therebetween, wherein sense current is configured to flow in a direction that is perpendicular to film planes of the magnetic field detecting element, said method comprising the steps of:

forming a spacer adjoining layer that is adjacent to said spacer layer, Heusler alloy layer, and a metal layer successively in this order; and forming either at least a part of said pinned layer or said free layer by heating said spacer adjoining layer, said Heusler alloy layer, and said metal layer;

wherein said spacer adjoining layer comprises a layer that is chiefly made of cobalt and iron;

wherein said Heusler alloy layer includes metal which is silver, gold, copper, palladium, or platinum, or an alloy thereof; and wherein said metal layer is made of silver, gold, copper, palladium, or platinum, or an alloy thereof.

2. The method according to claim 1, wherein said metal that is included in said Heusler alloy layer is the same as material that constitutes said metal layer.

3. The method according to claim 2, wherein the silver that is included in said Heusler alloy layer has an atomic fraction ranging between 1% and 20%.

4. The method according to claim 3, wherein said free layer is formed by heating said spacer adjoining layer, said Heusler alloy layer, and said metal layer, wherein said metal layer has a thickness ranging between 0.2 nm and 2 nm.

5. The method according to claim 3, wherein said pinned layer comprises: an outer pinned layer whose magnetization direction is fixed with respect to the external magnetic field; and an inner pinned layer whose magnetization direction is fixed by said outer pinned layer, said inner pinned layer being disposed closer to said spacer layer than said outer pinned layer;

wherein said inner pinned layer is formed by heating said spacer adjoining layer, said Heusler alloy layer, and said metal layer, and wherein said metal layer has a thickness ranging between 0.2 nm and 0.4 nm.

6. The method according to claim 1, wherein said spacer adjoining layer, said Heusler alloy layer, and said metal layer are heated at a temperature ranging between 523 K and 673 K.

* * * * *